(12) United States Patent
Nakamura et al.

(10) Patent No.: US 8,466,516 B2
(45) Date of Patent: Jun. 18, 2013

(54) SEMICONDUCTOR DEVICE

(75) Inventors: Kazutoshi Nakamura, Kanagawa-ken (JP); Norio Yasuhara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 12/886,461

(22) Filed: Sep. 20, 2010

(65) Prior Publication Data

US 2011/0108915 A1 May 12, 2011

(30) Foreign Application Priority Data

Nov. 9, 2009 (JP) ................................. 2009-256266

(51) Int. Cl.
*H01L 29/66* (2006.01)
(52) U.S. Cl.
USPC .................................. 257/341; 257/E29.242
(58) Field of Classification Search
USPC .......................................... 257/341, E29.242
See application file for complete search history.

(56) References Cited

U.S. PATENT DOCUMENTS

2008/0180974 A1* 7/2008 Shiraishi et al. ................ 363/24
2010/0140715 A1 6/2010 Nakamura et al.

FOREIGN PATENT DOCUMENTS

| JP | 2004-039773 | 2/2004 |
|---|---|---|
| JP | 2004-214611 | 7/2004 |
| JP | 2007-234897 | 9/2007 |
| JP | 2010-003836 | 1/2010 |

OTHER PUBLICATIONS

Japanese Office Action dated Oct. 28, 2011, filed in Japanese counterpart Application No. 2009-256266, 4 pages (with English translation).
J. Sonsky et al., "Towards universal and voltage-scalable high gate- and drain-voltage MOSFETs in CMOS", Power Semiconductor Devices & IC's, 2009. ISPSD 2009. 21$^{st}$ International Symposium on Jun. 18, 2009, pp. 315-318.
Office Action mailed Jul. 13, 2011, in Japanese counterpart Application No. 2009-256266 and translation, 7 pages.
A. Heringa, et al., "Innovative lateral field plates by gate fingers on STI regions in deep submicron CMOS," Proceedings of the 20$^{th}$ International Symposium on Power Semiconductor Devices and IC's, May 18-22, 2008, pp. 271-274.
J. Sonsky, et al., "Towards universal and voltage-scalable high gate- and drain-voltage MOSFETs in CMOS," Proceedings of the 21$^{st}$ International Symposium on Power Semiconductor Devices and IC's, 2009, pp. 315-318.

* cited by examiner

*Primary Examiner* — Lex Malsawma
(74) *Attorney, Agent, or Firm* — Patterson & Sheridan, LLP (57) ABSTRACT

According to one embodiment, a semiconductor device includes a semiconductor substrate of a first conductivity type, an element isolation insulator, a source layer of a second conductivity type, a drain layer of the second conductivity type, a contact layer of the first conductivity type and a gate electrode. The element isolation insulator is formed on the semiconductor substrate. The source layer is formed on the semiconductor substrate and is in contact with a side surface of the element isolation insulator. The drain layer is formed on the semiconductor substrate, is in contact with the side surface, and is spaced from the source layer. The contact layer is formed between the source layer and the drain layer. The gate electrode is provided on the element isolation insulator along the side surface.

16 Claims, 8 Drawing Sheets

SEMICONDUCTOR DEVICE

CROSS-REFERENCE TO RELATED APPLICATIONS

This application is based upon and claims the benefit of priority from the prior Japanese Patent Application No. 2009-256266, filed on Nov. 9, 2009; the entire contents of which are incorporated herein by reference.

FIELD

Embodiments described herein relate generally to a semiconductor device.

BACKGROUND

Recently, integration of a complementary metal oxide semiconductor (CMOS) device with a power device has been required for purposes such as mixed mounting of a power device and a control circuit thereof on a single chip. In this case, a lateral power MOSFET to which a high voltage is applied is formed on a CMOS chip having a fine structure. However, the lateral power MOSFET is required to have a high breakdown voltage, and therefore needs to be provided with a thicker gate oxide film than a gate oxide film of the CMOS. Meanwhile, the CMOS cannot have a thick gate oxide film for a high-speed operation. Nevertheless, when two types of gate oxide films are formed on a single chip, the number of manufacturing processes is considerably increased, and thus the manufacturing cost is increased.

Hence, there has been proposed a technique utilizing shallow trench isolation (STI) instead of forming a thick gate oxide film. For example, Document "J. Sonsky et. al., 'Towards universal and voltage-scalable high gate- and drain-voltage MOSFETs in CMOS' 2009 International Symposium on Power Semiconductor Devices and ICs, p. 315" discloses a technique by which: STI is formed in a p-type well; an opening of rectangular solid shape is formed in the STI; an $n^+$-type source layer and an $n^+$-type drain layer are formed in both end portions of the opening, respectively; and a gate electrode is formed on the STI. With this technique, a distance between the gate electrode and the well can be secured by arranging the gate electrode on an upper surface of the STI and arranging the well on side surfaces of the STI. This technique can form a lateral power MOSFET having a high breakdown voltage on a CMOS chip only by changing a mask layout without adding a process of forming a thick gate oxide film. However, studies by the inventors of the invention and others have revealed that there is a possibility that the device described in the aforementioned Document does not have a sufficient avalanche resistance and electrostatic discharge (ESD) resistance.

DETAILED DESCRIPTION

In general, according to one embodiment, a semiconductor device includes a semiconductor substrate of a first conductivity type, an element isolation insulator, a source layer of a second conductivity type, a drain layer of a second conductivity type, a contact layer of the first conductivity type and a gate electrode. The element isolation insulator is formed on the semiconductor substrate. The source layer is formed on the semiconductor substrate and is in contact with a side surface of the element isolation insulator. The drain layer is formed on the semiconductor substrate, is in contact with the side surface, and is spaced from the source layer. The contact layer is formed between the source layer and the drain layer. The gate electrode is provided on the element isolation insulator along the side surface.

Hereinbelow, embodiments of the invention will be described with reference to the drawings.

Firstly, a first embodiment will be described.

Figure 1A:
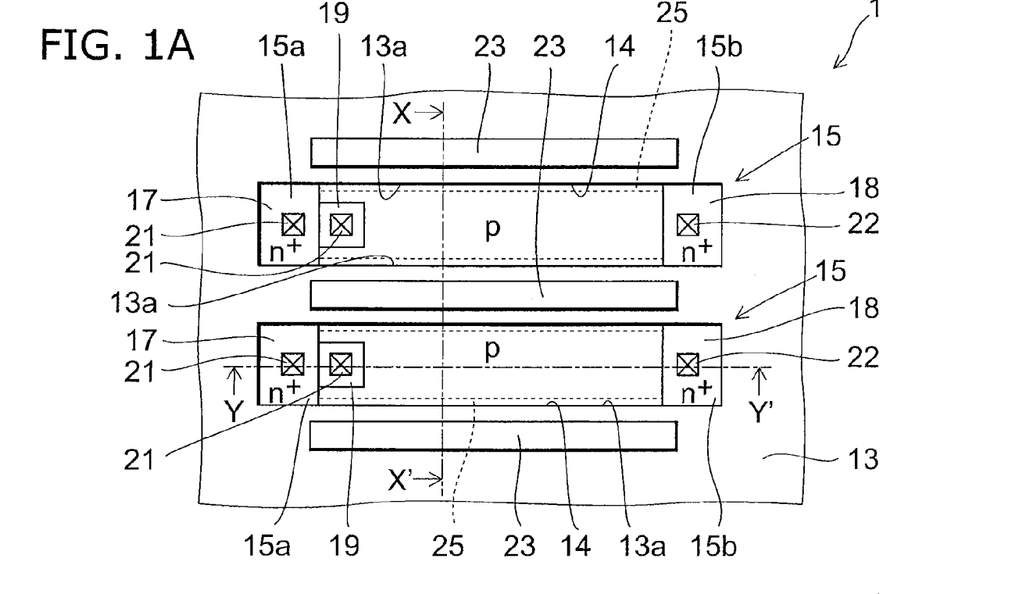
FIG. 1A is a plan view illustrating a semiconductor device according to a first embodiment.
Figure 1B:
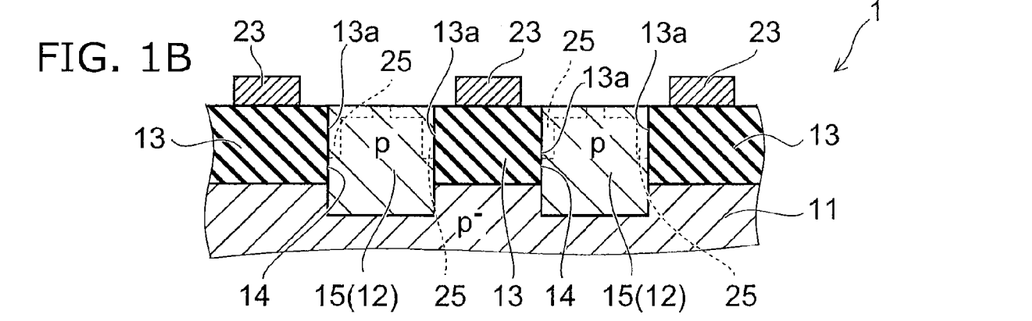
FIG. 1B is a cross-sectional view taken along the X-X' line shown in FIG. 1A.
Figure 1C:
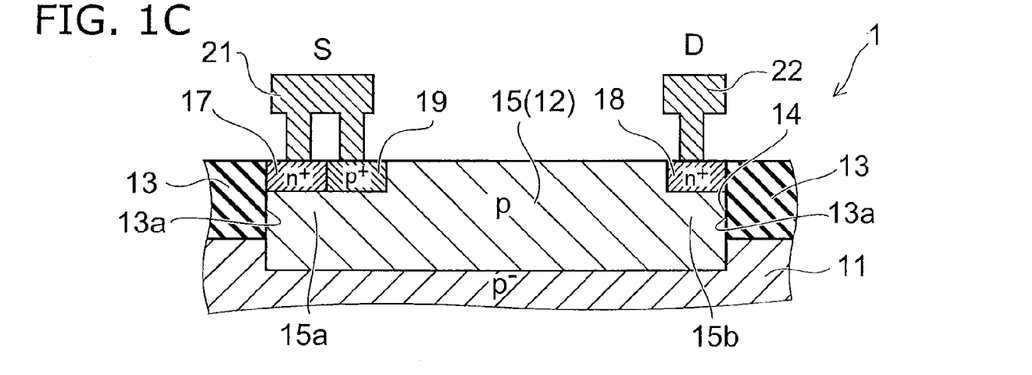
FIG. 1C is a cross-sectional view taken long the Y-Y' line shown in FIG. 1A.

FIG. 1A is a plan view illustrating a semiconductor device according to this embodiment. FIG. 1B is a cross-sectional view of the semiconductor device taken along the X-X' line shown in FIG. 1A. FIG. 1C is a cross-sectional view of the semiconductor device taken along the Y-Y' line shown in FIG. 1A.

As shown in FIGS. 1A to 1C, a semiconductor device 1 according to this embodiment is provided with a semiconductor substrate 11 of $p^-$-conductivity type. The semiconductor substrate 11 is a monocrystal silicon substrate, for example. Wells 12 of p-conductivity type are selectively formed on the semiconductor substrate 11. An effective impurity concentration of the wells 12 is higher than an effective impurity concentration of the semiconductor substrate 11. Note that the "effective impurity concentration" herein refers to an impurity concentration which contributes to electrical conduction of a semiconductor material. For example, when a semiconductor material includes both an impurity serving as a donor and an impurity serving as an acceptor, the "effective impurity concentration" is a concentration obtained after subtracting an offset between the donor and acceptor from activated impurities.

An STI 13 is formed on the semiconductor substrate 11 selectively. The STI 13 is used as an element isolation insulator in the semiconductor device 1 on the whole. For example, when the semiconductor substrate 11 is formed of silicon, the STI 13 is formed of a silicon oxide. Multiple opening regions 14 of a stripe shape are formed in the STI 13 in parallel with each other. Each of the well 12 is disposed in each opening region 14. The well 12 is formed deeper than the STI 13 is. Hereinbelow, a portion of the well 12, which is located in the opening region 14 of the STI 13 and directly below the opening region 14 is referred to as an active portion 15. In this embodiment, the active portion 15 has a rectangular solid. In addition, both end portions of the active portion 15 in a longitudinal direction thereof are respectively referred to as end portions 15a and 15b.

A source layer 17 of $n^+$-conductivity type is formed on the one end portion 15a of the active portion 15. The source layer 17 is formed in the active portion 15 entirely in the width direction of the active portion 15, and is in contact with three of side surfaces 13a of the STI 13, in the end portion 15a. In contrast, a drain layer 18 of $n^+$-conductivity type is formed on the other end portion 15b of the active portion 15. The drain layer 18 is formed in the active portion 15 entirely in the width direction of the active portion 15, and is in contact with three of the side surfaces 13a of the STI 13, in the end portion 15b. The drain layer 18 is spaced away from the source layer 17.

In addition, a contact layer 19 of $p^+$-conductivity type is formed on the active portion 15 between the source layer 17 and the drain layer 18. An effective impurity concentration of the contact layer 19 is higher than an effective impurity concentration of the well 12. The contact layer 19 comes in contact with the source layer 17, and is spaced away from the STI 13. Specifically, the well 12 exists at both sides of the contact layer 19 in the width direction of the active portion 15, in other words, between the contact layer 19 and the STI 13.

Besides, a source electrode 21 is provided immediately on the source layer 17 and the contact layer 19. The source electrode 21 is commonly connected to the source layer 17 and the contact layer 19. In contrast, a drain electrode 22 is provided immediately on the drain layer 18. The drain electrode 22 is connected to the drain layer 18.

Furthermore, gate electrodes 23 of stripe shape are provided on the STI 13. Each of the gate electrodes 23 is arranged on an upper surface of the STI 13 along a longitudinal one of the side surfaces 13a and spaced from the side surface 13a by a certain distance. To put it differently, a longitudinal direction of the gate electrode 23 is the same as a longitudinal direction of the opening region 14, and distances each between the gate electrode 23 and the side surface 13a of the STI 13 are approximately uniform. The gate electrode 23 also extends from a vicinity of the source layer 17 to a vicinity of the drain layer 18. For example, when the multiple opening regions 14 are formed in parallel with each other, gate electrodes 23 are arranged between the opening regions 14, and on both sides of a row consisted of the opening regions 14.

Meanwhile, a CMOS (unillustrated) configuring a control circuit is formed outside the well 12 in the semiconductor substrate 11. A gate insulating film of the CMOS is thinner than the STI 13.

Next, a description is given of an operation of this embodiment.

In the semiconductor device 1 according to this embodiment, lateral power MOSFETs are each configured of the active portion 15, the STI 13 and the gate electrode 23. For example, when a ground potential is applied to the source layer 17 and the contact layer 19 by the source electrode 21, and a positive voltage is applied to the drain layer 18 by the drain electrode 22, a depletion layer is dispersed from an interface between the p-type well 12 and the $n^+$-type drain layer 18. When a positive voltage which is equal to or higher than a threshold voltage is applied to the gate electrode 23 in this state, an electric field is generated between the gate electrode 23 and the well 12, inversion layers 25 are each formed in an upper portion of the active portion 15 of the well 12 along the side surfaces 13a of the STI 13 and an upper portion of the well 12 close to the gate electrode 23, and thus the lateral power MOSFET becomes an ON state.

Then, when the lateral power MOSFET becomes an OFF state from the ON state, for example, with an inductance connected to the drain electrode 22, a high voltage exceeding a breakdown voltage is applied between the drain layer 18 and the source layer 17. Thereby, the electric field in the well 12 reaches a critical electric field, an avalanche breakdown occurs, and hole-electron pairs are generated. Electrons generated at this time flow into the drain layer 18, while holes head for the source layer 17.

In this embodiment, however, since the $p^+$-type contact layer 19 connected to the source electrode 21 is provided in front of the source layer 17 as viewed from the drain layer 18, most of the generated holes flow into the contact layer 19, and is discharged to the source electrode 21 through the contact layer 19. For this reason, a large-volume hole current does not flow into the source layer 17. This prevents a voltage drop involved with hole current flow and making a potential of the well 12 higher than a potential of the source layer 17. Thereby, this prevents a pn interface between the p-type well 12 and the $n^+$-type source layer 17 from being biased forward, and also prevents a parasitic npn transistor formed of the $n^+$-type drain layer 18, the p-type well 12 and the $n^+$-type source layer 17 from becoming an ON state.

In the semiconductor device 1, an avalanche current flows through a pn diode which is formed of the p-type well 12 and the $n^+$-type source layer 17 and which is biased reversely. Since the pn diode does not snap back as the npn transistor does, the current is not likely to be concentrated at one location and is likely to flow in such a manner as to be even in the width direction of the entire active portion 15. This prevents a large amount of heat from being generated locally in a portion where the current is concentrated. Consequently, the semiconductor device 1 has a high avalanche resistance.

This holds true for a case where ESD current is applied to the source electrode 21 or the drain electrode 22. To put it differently, an ESD current flows evenly in the width direction of the active portion 15, and is not likely to be concentrated at one location. For this reason, the semiconductor device 1 is not likely to have locally generated heat even though the ESD current is applied thereto, and thus has a high ESD resistance.

Meanwhile, as described above, in the semiconductor device 1, an electric field is generated between the gate electrode 23 and the well 12 when the lateral power MOSFET is in the ON state, and thus the inversion layer 25 is formed: in the upper portion of the portion of the active portion 15 coming in contact with the side surface 13a of the STI 13; and near the gate electrode 23 in the upper portion of the active portion 15. If the inversion layer 25 is blocked by the contact layer 19, an effective channel width of the lateral power MOSFET is decreased. However, the electric field generated from the gate electrode 23 is attenuated in inverse proportion to a distance from the gate electrode 23. Thus, in the portion of the inversion layer 25 formed in the upper portion of the active portion 15, charges are generated more in a portion of the inversion layer 25 close to the gate electrode 23, and are generated less in a portion farther from the gate electrode 23. In addition, the contact layer 19 is spaced away from the STI 13. Therefore, even if the inversion layer 25 is blocked by the contact layer 19, only a few charges are generated in the blocked portion, thus giving a less impact. Meanwhile, the portion of the inversion layer 25 coming in contact with the side surface 13a of the STI 13 is not blocked by the contact layer 19, because the contact layer 19 is spaced away from the STI 13. As a consequence, the avalanche resistance and the ESD resistance can be improved while checking decrease of the effective channel width due to the existence of the contact layer 19. In contrast, if such a contact layer is formed on the drain side as viewed from the source layer in an ordinary laterally diffused MOS (LDMOS), a channel width is decreased by the length of the provided contact layer, and thus an ON current is decreased.

Hereinbelow, a description is given of an effect of this embodiment.

According to this embodiment, when the gate electrode 23 is provided on the STI 13, the distance between the well 12 and the gate electrode 23 can be secured and thus a breakdown voltage can be secured, without forming a thick gate oxide film exclusively for the power device. This enables mixed mounting, that is, the power device on the CMOS device, by changing the mask layout instead of largely adding processes.

In addition, according to this embodiment, the aforementioned operation allows the avalanche current and the ESD current to flow evenly, thus preventing heat locally generated due to the current concentration. Thereby, the semiconductor device 1 according to this embodiment has the high avalanche resistance and ESD resistance.

Furthermore, since the contact layer 19 is spaced away from the STI 13 in this embodiment, decrease of the effective channel width due to the presence of the contact layer 19 can be checked, and thus decrease of the ON current can be checked.

Next, a description is given of a comparative example of this embodiment.

Figure 2A:
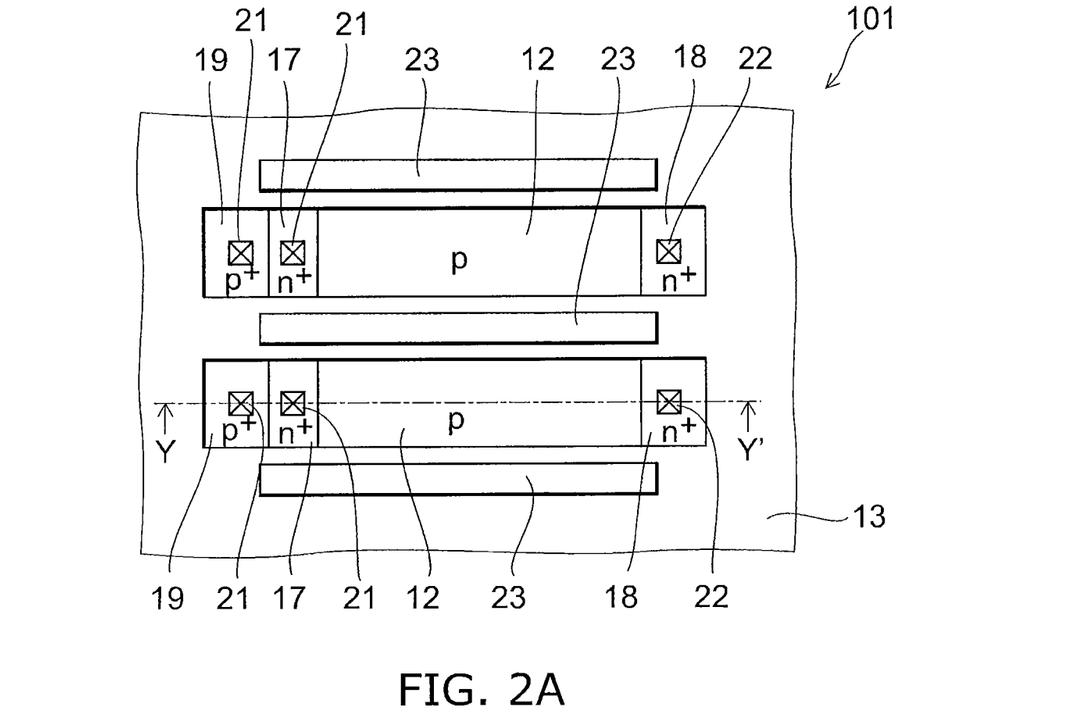
FIG. 2A is a plan view illustrating a semiconductor device according to a comparative example.
Figure 2B:
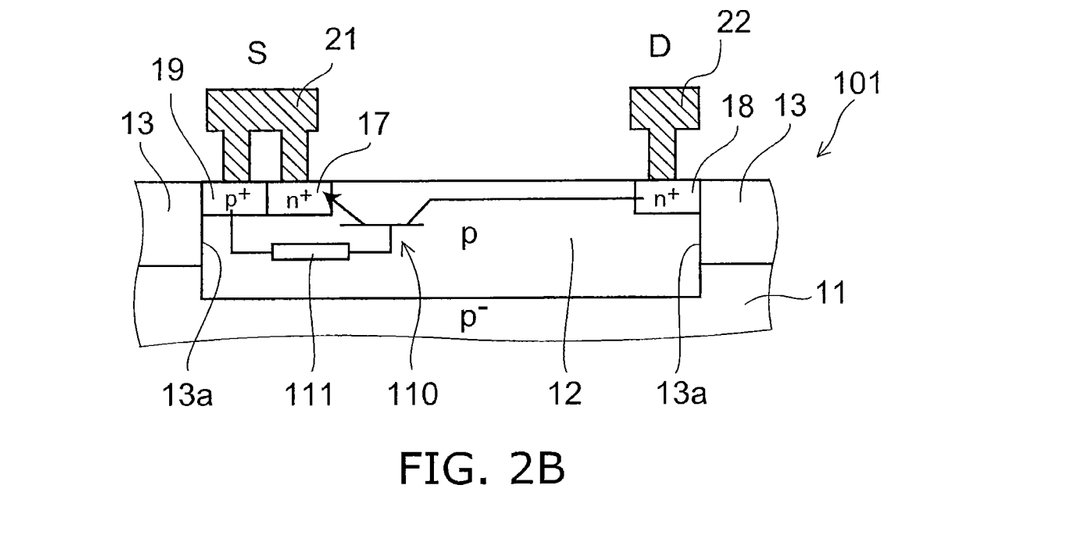
FIG. 2B is a cross-sectional view taken along the Y-Y' line shown in FIG. 2A.

FIG. 2A is a plan view illustrating a semiconductor device according to this comparative example. FIG. 2B is a cross-sectional view of the semiconductor device taken along the Y-Y' line shown in FIG. 2A.

As shown in FIGS. 2A and 2B, a semiconductor device 101 according to this comparative example has an inverse positional relationship between a source layer 17 and a contact layer 19 as compared to the semiconductor device 1 according to the first embodiment (see FIG. 1). To put it differently, the contact layer 19 is located on the opposite side of the source layer 17 from a drain layer 18.

In the semiconductor device 101, when an avalanche breakdown occurs in an active portion 15, a hole current generated becomes a base current of a parasitic npn transistor 110 formed of the $n^+$-type drain layer 18, a p-type well 12 and the $n^+$-source layer 17, and flows from the well 12 to the source layer 17. At this time, a voltage drop occurs by flowing of a hole current into a parasitic resistance 111 in a base. The voltage drop causes a potential of the p-type well 12 to be higher than a potential of the $n^+$-source layer 17, and thus a pn interface between the base and an emitter, that is, between the p-type well 12 and the $n^+$-type source layer 17 is biased forward. As a result, the parasitic npn transistor 110 becomes an ON state.

When the parasitic npn transistor 110 becomes the ON state in a portion of the active portion 15 in a width direction thereof, an ON resistance in the portion is lowered, and thus the current flows more. For this reason, the parasitic npn transistor 110 does not become the ON state in the other portion in the width direction, and the current concentratedly flows to the portion firstly becoming the ON state. Then, a temperature is increased locally in the portion in which the current is concentrated, a semiconductor substrate 11 is melted, and the semiconductor device 101 is physically destroyed. In particular, in the semiconductor device 101 in comparison with a normal LDMOS, the active portion 15 is surrounded by the STI 13, thus generated heat is not likely to escape, and the temperature is likely to increase locally. Accordingly, the semiconductor device 101 has a low avalanche resistance. For the similar reason, the semiconductor device 101 has a low ESD resistance.

Next, a second embodiment will be described.

Figure 3A:
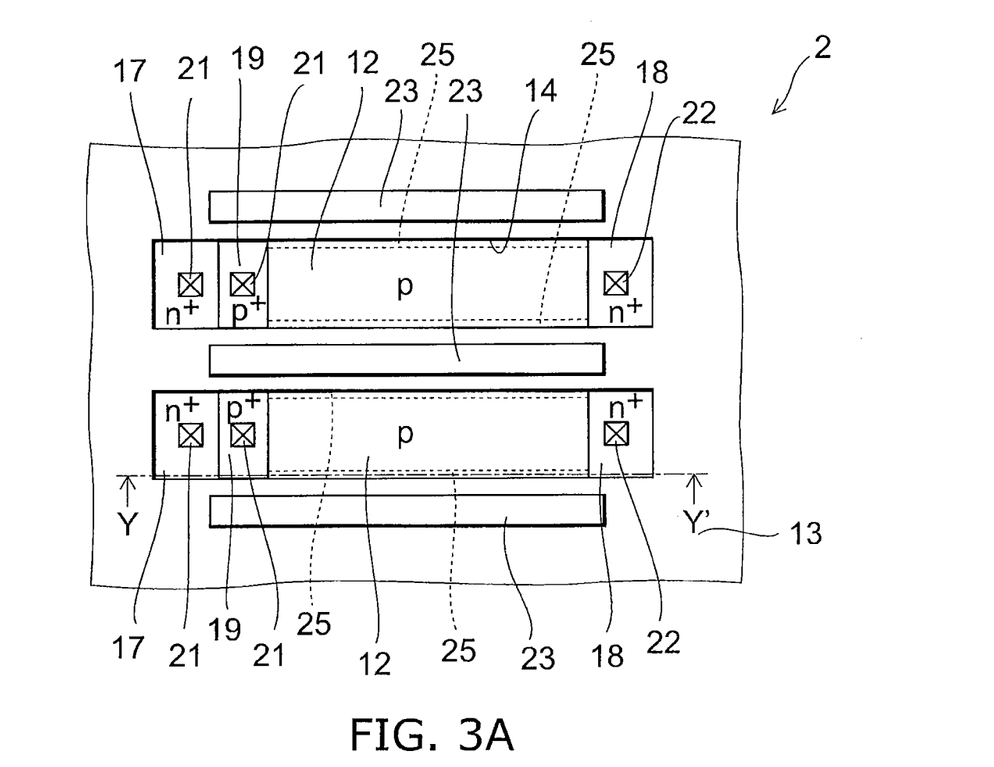
FIG. 3A is a plan view illustrating a semiconductor device according to a second embodiment.
Figure 3B:
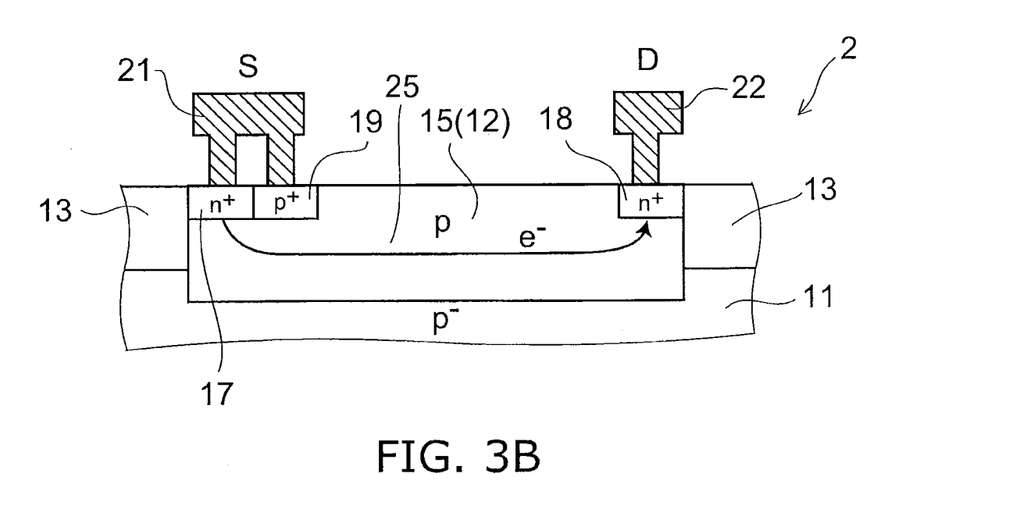
FIG. 3B is a cross-sectional view taken along the Y-Y' line shown in FIG. 3A.

FIG. 3A is a plan view illustrating a semiconductor device according to this embodiment. FIG. 3B is a cross-sectional view of the semiconductor device taken along the Y-Y' line shown in FIG. 3A.

As shown in FIGS. 3A and 3B, in a semiconductor device 2 according to this embodiment, contact layers 19 are each formed along the entire width of an active portion 15, and each come in contact with side surfaces 13a of an STI 13 on both end sides of the active portion 15 in the width direction, as compared to the semiconductor device 1 according to the aforementioned first embodiment (see FIG. 1).

As shown in FIG. 3B, in the semiconductor device 2, when a lateral power MOSFET becomes an ON state, an inversion layer 25 is formed in a portion coming in contact with a corresponding one of the side surfaces 13a in a well 12. Electrons forming an ON current flow through the inversion layer 25 in such a manner as to detour below the contact layer 19. A configuration and an operation other than the above in this embodiment are similar to those in the aforementioned first embodiment.

In this embodiment, as compared to the aforementioned first embodiment, not only the source layer 17 and the drain layer 18 but also the contact layer 19 is formed along the entire width of the stripe-shaped active portion 15. This eliminates the need for providing a gap between the STI 13 and the contact layer 19. Thus, even if the semiconductor device 2 is made finer, the contact layer 19 can be formed stably. This facilitates the manufacturing of the semiconductor device 2, and stabilizes the characteristics. As described above, the configuration in this embodiment is advantageous when a semiconductor device is made finer.

Effects other than the above in this embodiment are similar to those in the aforementioned first embodiment. To put it differently, also in this embodiment, provision of a gate electrode 23 on the STI 13 enables mixed mounting, that is, a power device on a CMOS device without largely adding processes. Furthermore, forming the contact layer 19 on the drain layer 18 side as viewed from the source layer 17 can improve the avalanche resistance and the ESD resistance.

Next, a third embodiment will be described.

Figure 4A:
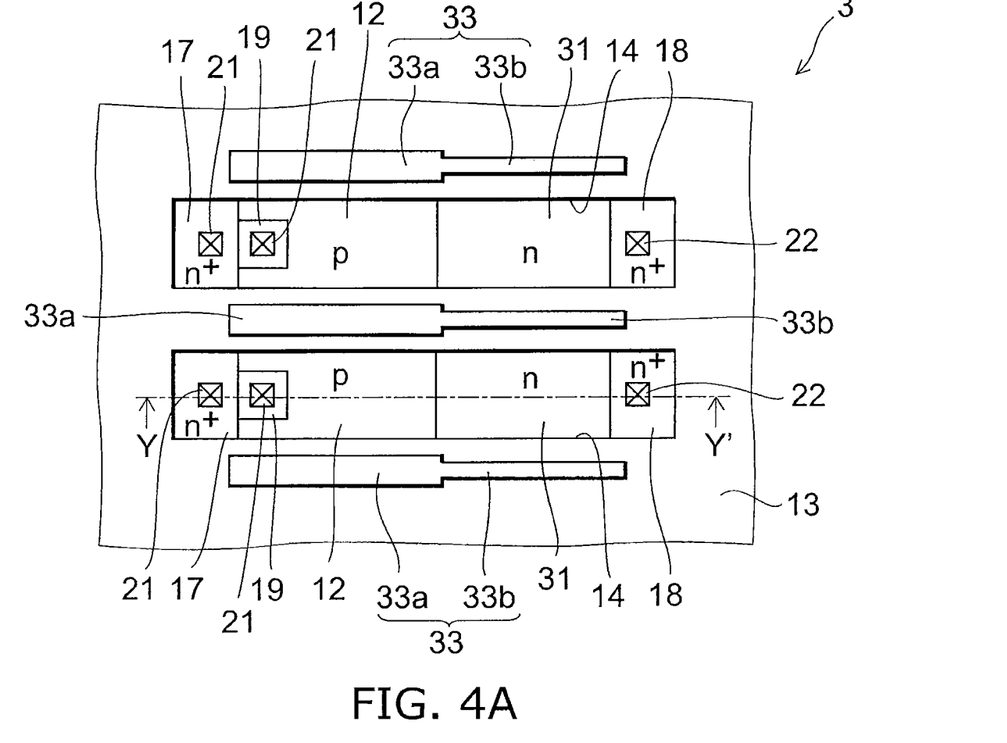
FIG. 4A is a plan view illustrating a semiconductor device according to a third embodiment.
Figure 4B:
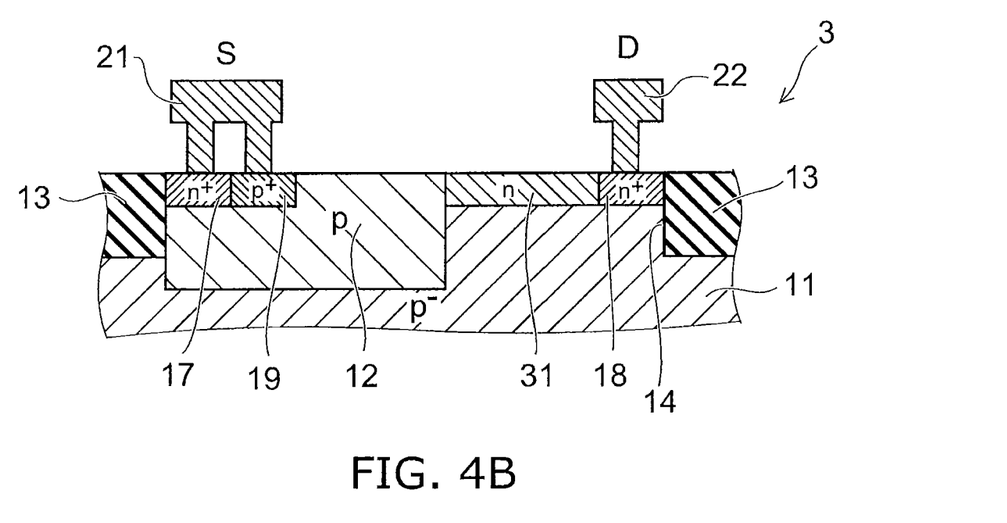
FIG. 4B is a cross-sectional view taken along the Y-Y' line shown in FIG. 4A.

FIG. 4A is a plan view illustrating a semiconductor device according to this embodiment. FIG. 4B is a cross-sectional view of the semiconductor device taken along the Y-Y' line shown in FIG. 4A.

As shown in FIGS. 4A and 4B, a semiconductor device 3 according to this embodiment is different from the semiconductor device 1 according to the aforementioned first embodiment (see FIG. 1) in that drift layers are formed, and is different in shape of gate electrodes.

Specifically, in the semiconductor device 3 according to this embodiment, wells 12 are each formed only on the source layer 17 side in an opening region 14 of an STI 13. In addition, drift layers 31 are each formed between a drain layer 18 and the well 12. Each of the drift layers 31 comes in contact with both the drain layer 18 and the well 12. The conductivity type of the drift layer 31 is the n-type, and an effective impurity concentration thereof is lower than an effective impurity concentration of the drain layer 18.

Meanwhile, gate electrodes 33 are provided on the STI 13 in the semiconductor device 3. Each of the gate electrodes 33 has a stripe shape, but the width thereof is different in a longitudinal direction. Specifically, the gate electrode 33 is provided with a source-side portion 33a arranged near a source layer 17 and the well 12 and a drain-side portion 33b arranged near the drift layer 31 and the drain layer 18. The source-side portion 33a and the drain-side portion 33b are formed integrally with each other. A center axis of the source-side portion 33a and a center axis of the drain-side portion 33b are arranged on the same line, and the drain-side portion 33b is narrower than the source-side portion 33a. Accordingly, in the semiconductor device 3, the shortest distance between the gate electrode 33 and the drain layer 18 is longer than the shortest distance between the gate electrode 33 and the source layer 17. A configuration other than the above in this embodiment is similar to that in the aforementioned first embodiment.

In this embodiment, the n-type drift layer 31 is provided between the $n^+$-type drain layer 18 and the p-type well 12. This can alleviate an electric field applied between the drain layer 18 and the well 12, and thus can improve the breakdown voltage between a drain and a source. Besides, the distance between the gate electrode 33 and the drain layer 18 is made longer, and thereby an electric field between a gate and the drain can be alleviated. As a consequence, a breakdown is less likely to occur between the gate and the drain, and thus the breakdown voltage between the gate and the drain can be improved. An operation and effects other than the above in this embodiment are similar to those in the aforementioned first embodiment.

Next, a fourth embodiment will be described.

Figure 5:
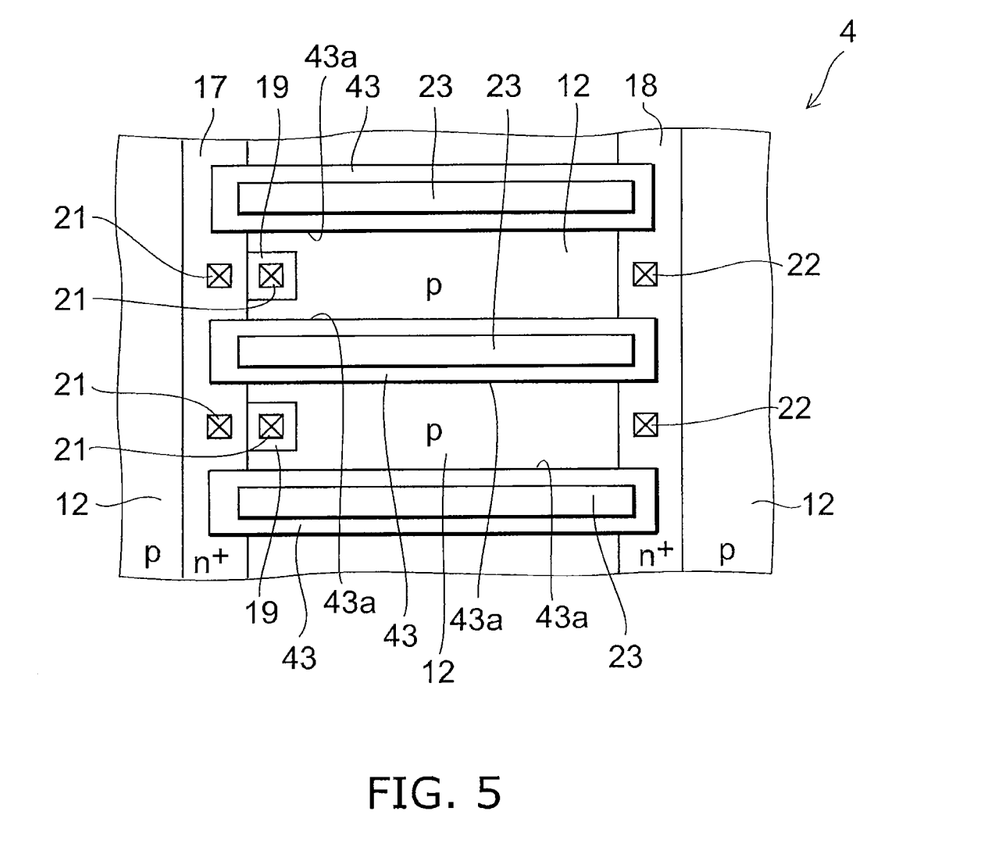
FIG. 5 is a plan view illustrating a semiconductor device according to a fourth embodiment.

FIG. 5 is a plan view illustrating a semiconductor device according to this embodiment.

As shown in FIG. 5, the shape of STIs is different in this embodiment as compared to the aforementioned first embodiment. The aforementioned first to third embodiments show examples in which each of the lateral power MOSFETs is formed in the rectangular solid region surrounded by the STI 13. In contrast, in this embodiment, the multiple STIs are each formed into a stripe shape, and a lateral power MOSFET is formed in a region between each adjacent two STIs.

Specifically, in a semiconductor device 4 according to this embodiment as shown in FIG. 5, a p-type well 12 is formed on a $p^-$-type semiconductor substrate 11, and an $n^+$-type source layer 17 and an $n^+$-type drain layer 18 are formed on the well 12, being spaced away from each other. On the well 12, multiple stripe-shaped STIs 43 are provided in parallel spaced away from each other. Each STI 43 extends from the source layer 17 to the drain layer 18. One end of the STI 43 is located inside the source layer 17, while the other end thereof is located inside the drain layer 18. In addition, a $p^+$-type contact layer 19 is formed in a region between each adjacent two STIs 43. The contact layer 19 comes in contact with the source layer 17, and is spaced away from the two STIs 43. Meanwhile, a gate electrode 23 is provided on each STI 43 in parallel with the STI 43. The gate electrode 23 is arranged along longitudinal side surfaces 43a of the STI 43 and spaced from the side surfaces 43a by a certain distance, and extends from a vicinity of the source layer 17 to a vicinity of the drain layer 18. A configuration and an operation other than the above in this embodiment are similar to those in the aforementioned first embodiment. Also with this embodiment, similar effects as those in the aforementioned first embodiment can be obtained.

Figure 6A:
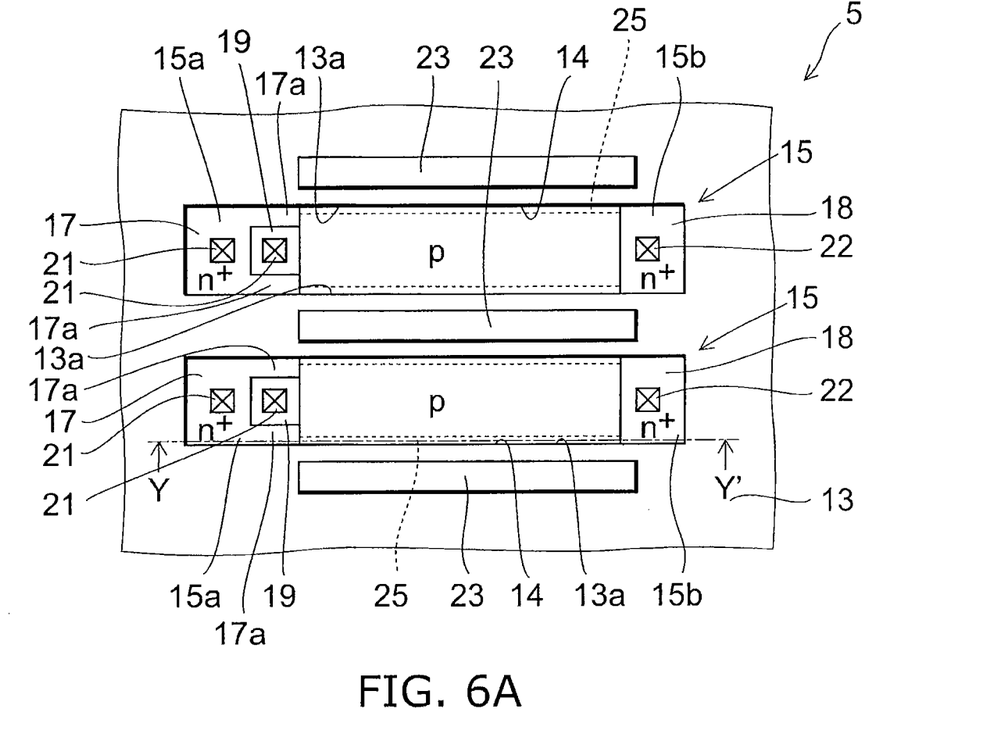
FIG. 6A is a plan view illustrating a semiconductor device according to a fifth embodiment.
Figure 6B:
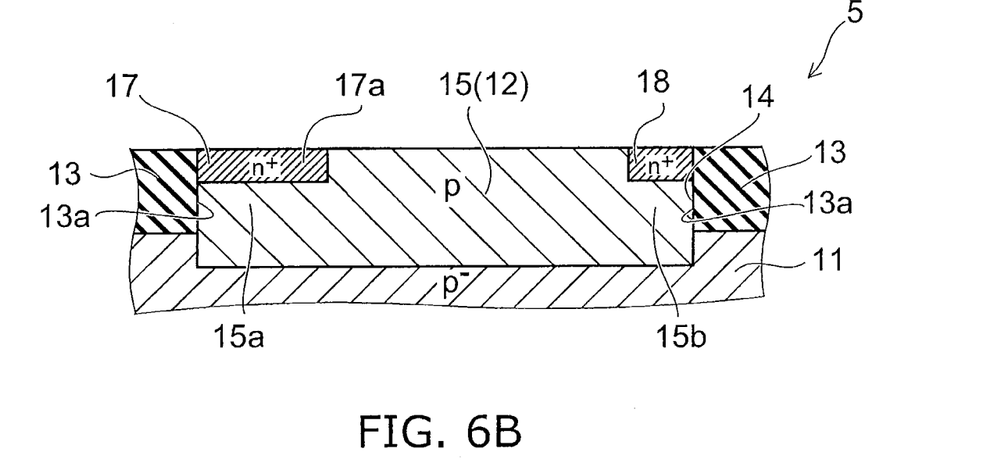
FIG. 6B is a cross-sectional view taken along the Y-Y' line shown in FIG. 6A.

Next, a fifth embodiment will be described. FIG. 6A is a plan view illustrating a semiconductor device according to this embodiment. FIG. 6B is a cross-sectional view of the semiconductor device taken along the Y-Y' line shown in FIG. 6A.

As shown in FIGS. 6A and 6B, a semiconductor device 5 according to this embodiment is different from the semiconductor device 1 according to the aforementioned first embodiment (see FIG. 1) in shape of source layers and length of gate electrodes.

Specifically, in the semiconductor device 5, extending portions 17a extending to a corresponding one of drain layers 18 are provided to both end portions of each of $n^+$-type source layers 17 in a width direction thereof. This means that the entire source layer 17 has a square U-shape when viewed from the above. Each of the extending portions 17a projects in such a manner as to be located between an STI 13 and a contact layer 19. The position of an end of the extending portion 17a is approximately the same as the position of an end of the contact layer 19 in a direction from the source layer 17 to the drain layer 18.

In addition, in the semiconductor device 5, the gate electrode 23 is made shorter by the length of extending the extending portion 17a. In other words, in the direction from the source layer 17 to the drain layer 18, the position of an edge of each of gate electrodes 23 on the source layer 17 side is approximately the same as the position of an edge of the extending portion 17a on the drain layer 18 side. A configuration other than the above in this embodiment is similar to that in the aforementioned first embodiment.

In this embodiment, the extending portions 17a are provided to the source layer 17, and thereby the channel length can be made shorter by the length of the extending portion 17a. The shortening of the channel length can improve the current driving capacity of lateral power MOSFETs. Meanwhile, each of the extending portions 17a is arranged between the STI 13 and the contact layer 19 and is not arranged between the drain layer 18 and the contact layer 19. Thus, a hole current generated due to an avalanche breakdown flows into the contact layer 19 without being blocked by the extending portion 17a. This prevents a potential in a portion of a well 12 coming in contact with the source layer 17 from being higher than a potential of the source layer 17, which would otherwise occur due to a voltage drop of the hole current. This also prevents a parasitic npn transistor from becoming an ON state. Accordingly, the provision of the extending portion 17a prevents the avalanche resistance from being lowered. Similarly, an ESD current flows into the contact layer 19 without being blocked by the extending portion 17a. This prevents the parasitic npn transistor from becoming the ON state, thus preventing the ESD resistance from being lowered. As described above, as compared to the aforementioned first embodiment, this embodiment can improve the current driving capacity while maintaining the avalanche resistance and the ESD resistance at constant levels, respectively. An operation and effects other than the above in this embodiment are similar to those in the aforementioned first embodiment.

Next, a variation of this embodiment will be described.

Figure 7:
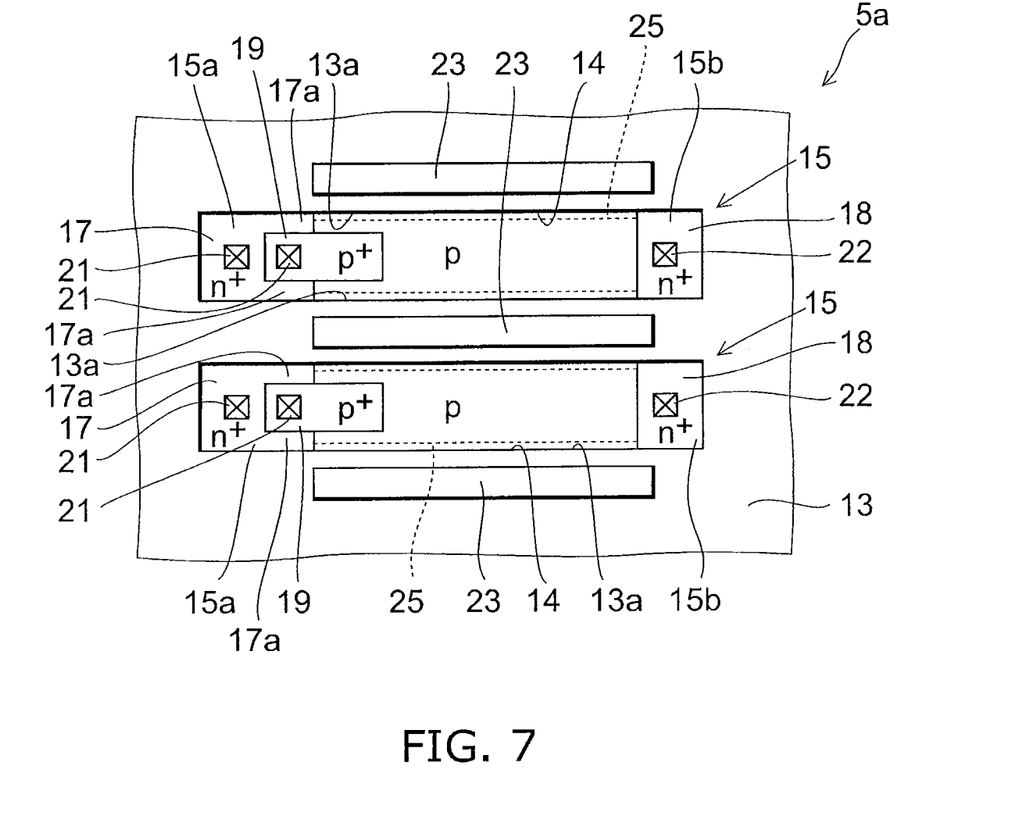
FIG. 7 is a plan view illustrating a semiconductor device according to a variation of the fifth embodiment.

FIG. 7 is a plan view illustrating a semiconductor device according to this variation.

As shown in FIG. 7, in a semiconductor device 5a according to this variation, in a direction from the source layer 17 to the drain layer 18, an end of a contact layer 19 is located closer to the drain layer 18 in a projecting manner than ends of the respective extending portions 17a are. This causes a hole current generated due to an avalanche breakdown to flow into the contact layer 19 more reliably. A configuration, an operation and effects other than the above in this modification are similar to those in the aforementioned fifth embodiment.

Next, a sixth embodiment will be described.

Figure 8A:
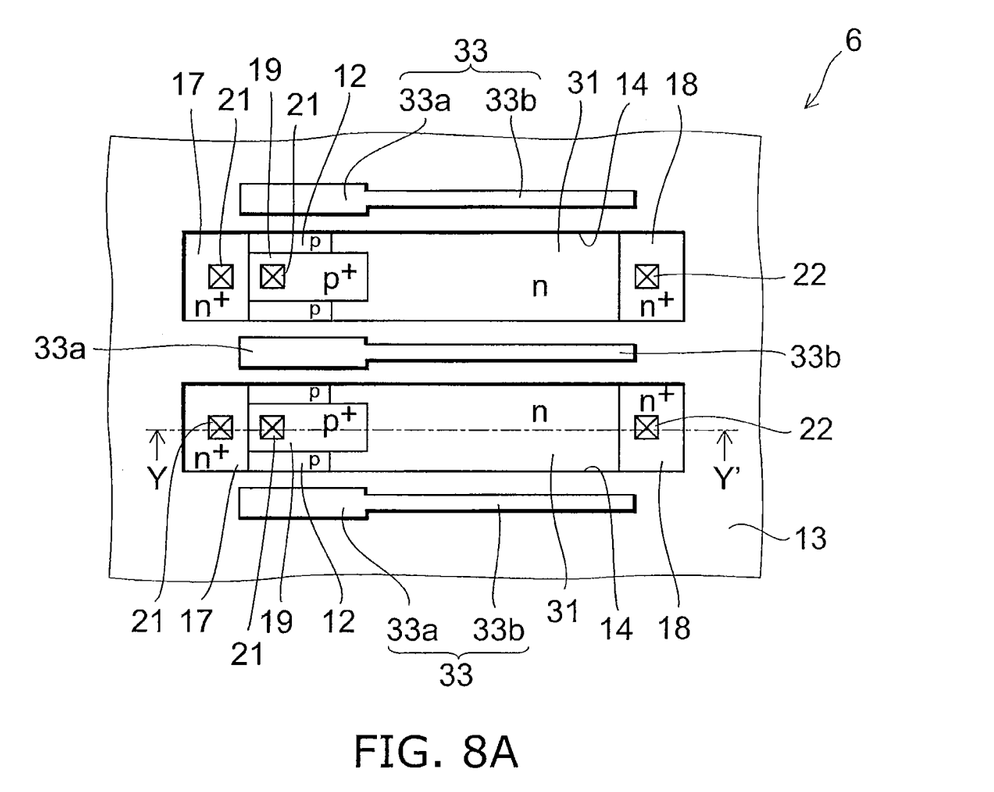
FIG. 8A is a plan view illustrating a semiconductor device according to a sixth embodiment.
Figure 8B:
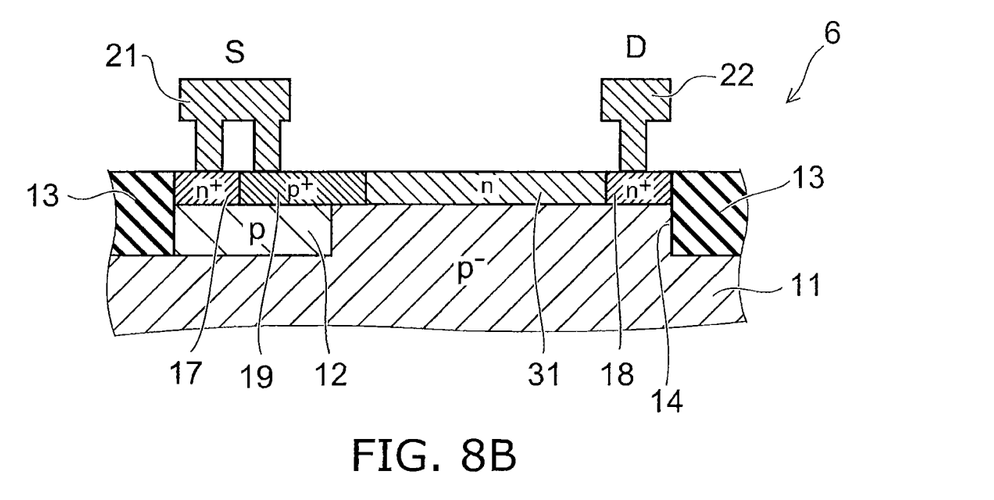
FIG. 8B is a cross-sectional view of the semiconductor device taken along the Y-Y' line shown in FIG. 8A.

FIG. 8A is a plan view illustrating a semiconductor device according to this embodiment. FIG. 8B is a cross-sectional view of the semiconductor device taken along the Y-Y' line shown in FIG. 8A.

As shown in FIGS. 8A and 8B, a semiconductor device 6 according to this embodiment is different from the semiconductor device 3 according to the aforementioned third embodiment (see FIG. 4) mainly in that interfaces each between a p-type well 12 and a drift layer 31 are shifted to the source layer 17 side and in that p⁺-type contact layers 19 are in contact with the respective drift layers 31.

To be more specific, as compared to the third embodiment, the p-type well 12 recedes to the source layer 17 side, and the n-type drift layer 31 extends to the source layer 17 side accordingly. In addition, along with the shift of the interface between the well 12 and the drift layer 31, a boundary between a source-side portion 33a and a drain-side portion 33b of a gate electrode 33 is shifted to the source layer 17 side. That is, the source-side portion 33a is made shorter and the drain-side portion 33b is made longer than those in the third embodiment. Furthermore, the contact layer 19 extends more to the drain layer 18 side than in the third embodiment. Thereby, the contact layer 19 projects from the well 12 and enters the drift layer 31, thereby being in contact with the drift layer 31. In other words, an edge of the contact layer 19 on the drain layer 18 side is located at a position shifted to a drain layer 18 from an interface between the well 12 and the drift layer 31. A configuration other than the above in this embodiment is similar to that in the aforementioned third embodiment.

In this embodiment, the interface between the p-type well 12 and the n-type drift layer 31 is shifted to the source layer 17 side, and thereby the channel length, i.e., a distance between a source layer 17 and the drift layer 31 is made shorter. This can improve the current driving capacity of the lateral power MOSFET and reduce the size of a device.

Note that when a voltage is applied between the source layer 17 and the drain layer 18 with the lateral power MOSFET in an OFF state, a depletion layer is generated from an interface between the well 12 and the drift layer 31. In this case, if a dosage of an impurity to be implanted into the drift layer 31 is set lower than a dosage of an impurity to be implanted into the well 12, the depletion layer spreads mainly toward the drift layer 31, but also spreads toward the well 12 to some extent. Then, when the depletion layer spreading toward the well 12 reaches the source layer 17, electrons are injected from the source layer 17 into the depletion layer, so that a leak current flows.

However, in this embodiment, the p⁺-type contact layer 19 extends into the drift layer 31. Thus, the depletion layer is generated from an interface between the contact layer 19 and the drift layer 31. In this case, since the contact layer 19 has a higher impurity concentration than the well 12 has, the depletion layer does not spread so much in the contact layer 19. For this reason, the depletion layer stops within the contact layer 19 and does not reach the source layer 17. Thereby, the leak current is less likely to be generated in this embodiment, even though the channel length is made shorter.

Meanwhile, a hole current generated due to an avalanche breakdown flows into the contact layer 19 without being blocked by the source layer 17. The same is applied to an ESD current. Thus, also in this embodiment like the aforementioned third embodiment, a favorable avalanche resistance and ESD resistance can be obtained. In other words, as compared to the aforementioned third embodiment, this embodiment can improve the current driving capacity while maintaining the avalanche resistance and ESD resistance at constant levels, respectively. An operation and effects other than the above in this embodiment are similar to those in the aforementioned third embodiment.

Hereinabove, the invention has been described by referring to the embodiments. However, the invention is not limited to the embodiments. The aforementioned embodiments may be carried out in combination with each other. In addition, any of the aforementioned embodiments to which those skilled in the art appropriately make an addition, a deletion or a design change of a constituent, or make an addition or an omission of a process or a change to conditions is included in the scope of the invention, as long as the embodiment includes a gist of the invention.

For example, although the aforementioned embodiments each show an example in which the conductivity types of the semiconductor substrate, the wells and the contact layers are the p-type, while the conductivity type of the source layers and the drain layers are the n-type, the conductivity types may be inverted from each other. In addition, although the aforementioned embodiments show examples in which the lateral power MOSFET is formed in the region surrounded by the STI or in the region between the STIs, the layout of each of the STIs, the source layers and the drain layers is not limited to these. What is required is that the source layer and the drain layer come in contact with the side surfaces of the STI.

The embodiments described above enable mixed mounting of a power device and a CMOS device, and achieve a semiconductor device including a power device having a high avalanche resistance and ESD resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:
1. A semiconductor device comprising:
a semiconductor substrate;
an element isolation insulator selectively formed on the semiconductor substrate and having a side surface;
a well of a first conductivity type formed between the element isolation insulator, the well being in contact with the side surface;
a source layer of a second conductivity type selectively formed on the well and being in contact with the side surface;
a drain layer of the second conductivity type selectively formed on the semiconductor substrate, being in contact with the side surface, and being spaced from the source layer;
a contact layer of the first conductivity type formed between the source layer and the drain layer, the contact layer being spaced from the side surface;
a source electrode connected to the source layer and the contact layer;
a drain electrode connected to the drain layer; and
a gate electrode provided on the element isolation insulator along the side surface, wherein:
the side surface extends in a direction from the source layer to the drain layer, and
the source layer includes a portion extending into a region between the contact layer and the side surface.

2. The device according to claim 1, wherein
the element isolation insulator further includes an opposing side surface facing the side surface and partitioning a stripe-shaped region with the side surface,
the source layer, the drain layer and the contact layer are disposed in the stripe-shaped region, and each of the source layer and the drain layer is formed entirely in a width direction of the stripe-shaped region.

3. The device according to claim 1, wherein
a stripe-shaped opening region is formed in the element isolation insulator, and
the source layer, the drain layer and the contact layer are disposed in the opening region.

4. The device according to claim 3, wherein a plurality of the opening regions are formed and arranged in parallel with each other.

5. The device according to claim 1, wherein the element isolation insulator has a stripe shape.

6. The device according to claim 1, wherein the gate electrode has a stripe shape.

7. The device according to claim 1, wherein the well has an effective impurity concentration higher than an effective impurity concentration of the semiconductor substrate, and
the drain layer is formed on the well.

8. The device according to claim 1, further comprising
a drift layer of the second conductivity type having an effective impurity concentration lower than an effective impurity concentration of the drain layer, being arranged between the drain layer and the well and being in contact with the drain layer.

9. The device according to claim 8, wherein the contact layer is in contact with the drift layer.

10. The device according to claim 9, wherein an edge of the contact layer on the drain layer side is located at a position shifted toward the drain layer from an interface between the well and the drift layer.

11. The device according to claim 1, wherein
the source layer, the drain layer and the contact layer are disposed in a stripe-shaped region between the element isolation insulator.

12. The device according to claim 11, wherein the source layer comprises a U-shape when viewed from the top.

13. The device according to claim 11, wherein an end of the portion extending into the region between the contact layer and the side surface is located at a position identical to an end portion of the contact layer in the direction.

14. The device according to claim 1, wherein a shortest distance between the gate electrode and the drain layer is longer than a shortest distance between the gate electrode and the source layer.

15. The device according to claim 14, wherein a portion of the gate electrode on the drain side is narrower than a portion of the gate electrode on the source side.

16. The device according to claim 1, further comprising a first transistor formed on the semiconductor substrate and including a gate insulating film thinner than the element isolation insulator,
the source layer, the drain layer, the contact layer and the element isolation insulator forming a second transistor.

* * * * *